United States Patent [19]
Schneider

[11] Patent Number: 5,172,301
[45] Date of Patent: Dec. 15, 1992

[54] HEATSINK FOR BOARD-MOUNTED SEMICONDUCTOR DEVICES AND SEMICONDUCTOR DEVICE ASSEMBLY EMPLOYING SAME

[75] Inventor: Mark R. Schneider, San Jose, Calif.

[73] Assignee: LSI Logic Corporation, Milpitas, Calif.

[21] Appl. No.: 773,681

[22] Filed: Oct. 8, 1991

[51] Int. Cl.⁵ .............................. H05K 7/20
[52] U.S. Cl. .................... 361/386; 165/185; 174/16.3; 257/720; 257/783
[58] Field of Search ............... 357/81; 165/80.3, 185; 174/16.3; 361/383, 386, 387, 388, 389

[56] References Cited

U.S. PATENT DOCUMENTS

| | | | |
|---|---|---|---|
| 4,141,030 | 2/1979 | Eisele et al. | 357/79 |
| 4,340,902 | 7/1982 | Honda et al. | 357/74 |
| 4,396,935 | 8/1983 | Schuck | 357/74 |
| 4,471,837 | 9/1984 | Larson | 165/185 |
| 4,563,725 | 1/1986 | Kirby | 361/388 |
| 4,587,550 | 5/1986 | Matsuda | 357/79 |
| 4,729,061 | 3/1988 | Brown | 361/386 |
| 4,803,546 | 2/1989 | Sugimoto et al. | 357/81 |
| 4,849,857 | 7/1989 | Butt | 361/388 |
| 4,890,194 | 12/1989 | Derryberry et al. | 361/386 |
| 4,941,067 | 7/1990 | Craft | 174/16.3 |
| 4,996,629 | 2/1991 | Christiansen | 361/400 |
| 5,012,386 | 4/1991 | McShane et al. | 361/386 |

FOREIGN PATENT DOCUMENTS

| | | | |
|---|---|---|---|
| 59-117244 | 2/1984 | Japan . | |
| 1217148 | 12/1970 | United Kingdom | 174/16.3 |

Primary Examiner—Gerald P. Tolin
Attorney, Agent, or Firm—Michael D. Rostoker; Gerald E. Linden

[57] ABSTRACT

A semiconductor device is mounted to one face of a printed wiring board (PWB). A heat sink is mounted to an opposite face of the board, opposite the die. The heat sink has a plurality (at least four) "nubs" protruding through a like plurality of holes in the board in the region of the die. In this manner, the nubs conduct heat from the die, through the board, to the heat sink. Preferably, the nubs are sized and shaped to press fit into the holes. Preferably, the holes are plated. Preferably, the heat sink is formed of powdered metal, such as aluminum, copper or a copper/tungsten alloy. The die is attached to the board by any suitable method, such as epoxy and wire bonding, tape automated bonding (TAB), etc. After the heat sink is mounted to the board, the die is encapsulated with resin. A multi-chip module using the novel heat sink structure is also disclosed.

10 Claims, 3 Drawing Sheets

HEATSINK FOR BOARD-MOUNTED SEMICONDUCTOR DEVICES AND SEMICONDUCTOR DEVICE ASSEMBLY EMPLOYING SAME

TECHNICAL FIELD OF THE INVENTION

The invention relates to heat sinks for semiconductor device assemblies, especially board-mounted semiconductor devices.

BACKGROUND OF THE INVENTION

As used herein, a "semiconductor device" is a silicon chip (die) containing circuit elements. A "semiconductor device assembly" is a silicon chip contained within a package and connected (wired or bonded) to conductive leads which exit the package.

Heat is inevitably generated during operation of a semiconductor device, and may become destructive of the device if left unabated. Therefore, it is generally well known to provide some sort of heat sink for semiconductor devices. Generally, heat sinks take one of two forms. They may be integral with the device package (assembly) or they may be external to the device package. The present invention is related to integral heatsinks that form part of the semiconductor device assembly. In either case, heat sinks generally include at least a heat-dissipating plate in intimate heat conductive relationship to the semiconductor device.

The problem of heat dissipation is especially relevant in semiconductor devices that have a high lead count or which operate at high speeds, both of which factors contribute significantly to the generation of heat by the device.

U.S. Pat. No. 4,803,546 discloses a heatsink package for flip-chip integrated circuits (ICs). A semiconductor element (die) 11 is mounted face (circuit side) downward on a substrate 12. The circuit elements on the die face the substrate, which has interconnects formed on its die-facing surface. A generally flat heatsink member 14 is soldered onto the back (circuitless) side of the die.

U.S. Pat. No. 4,340,902 discloses a chip 102 mounted on a plate 110. The plate 110 is mounted to another plate 100 which is mounted with resin or solder 114 to cooling means 107,108.

Japanese Patent Publication No. 59-117244 discloses a pellet (die) 30 bonded to the exposed surface of a heat sink 27.

While the references cited above show various techniques of mounting semiconductor dies, there is a need for a technique of providing an efficient heat sink structure in conjunction with board-mounted devices.

DISCLOSURE OF THE INVENTION

It is therefore an object of the present invention to provide a technique for improved heat dissipation in a semiconductor device assembly.

It is another object of the invention to provide a heat sink structure that is readily adapted to a number of different assembly configurations.

It is another object of the invention to provide a heat sink for board-mounted semiconductor devices.

According to the invention, a semiconductor device (die) is mounted to one face of a "substrate", such as a printed wiring board (PWB). A heat sink is mounted to an opposite face of the board, opposite the die. The heat sink has a plurality (at least four) "nubs" protruding through a like plurality of holes in the board in the region of the die. In this manner, the nubs conduct heat from the die, through the board, to the heat sink.

According to an aspect of the invention, the nubs are press fit into the holes.

The heat sink is preferably formed of powdered metal, selected from the group of materials including aluminum, copper or a copper/tungsten alloy, and is compacted into a plate shape as is well known in the art.

The substrate may be a printed wiring board (PWB) or a ceramic substrate.

The die is attached to the board by any suitable method, such as epoxy and wire bonding (circuit side away from PWB), tape automated bonding (TAB) (circuit side towards PWB), etc.

After the heat sink is mounted to the board, the die is encapsulated with resin.

Other objects, features and advantages of the invention will become apparent in light of the following description thereof.

DETAILED DESCRIPTION OF THE INVENTION

Figure 1:
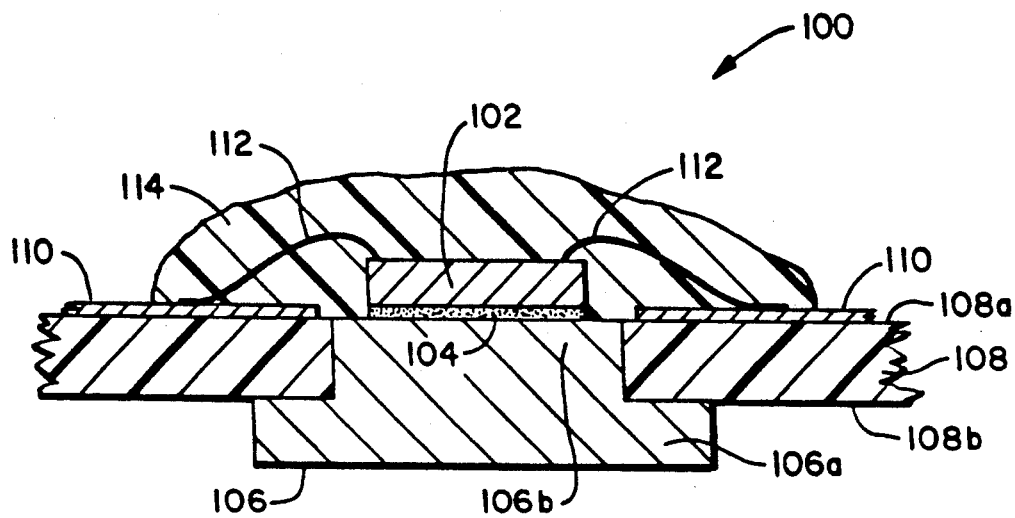
FIG. 1 is a cross-sectional view of a heat sink arrangement of the prior art.

FIG. 1 shows a semiconductor device assembly 100 of the prior art. A die 102 is mounted by a thermally-conductive adhesive 104 to a heat sink structure 106. The heat sink structure 106 is stepped, having a large plate-like heat dissipating portion 106a and a smaller "slug" portion 106b. The die 102 is mounted atop the slug 106b so as to be located on one side 108a of a printed wiring board (PWB) 108. Conductive traces 110 are located on the same side 108a of the PWB (same side as the die), and the die is attached by bond wires 112 to the conductive traces 110. The die and bond wires are encapsulated with an epoxy resin 114, which is applied to the one side 108a of the PWB.

The slug portion 106b of the heat sink extends through a hole in the PWB, and the heat dissipating portion 106a resides on a side 108b of the PWB opposite the die 102.

One problem with such a structure is that the thermal expansion characteristics of the heat sink are usually not well matched to either the board or the die, especially the die. Hence, in use, when the die is generating heat, the die may crack, rendering the entire (usually expensive) assembly useless.

Figure 2:
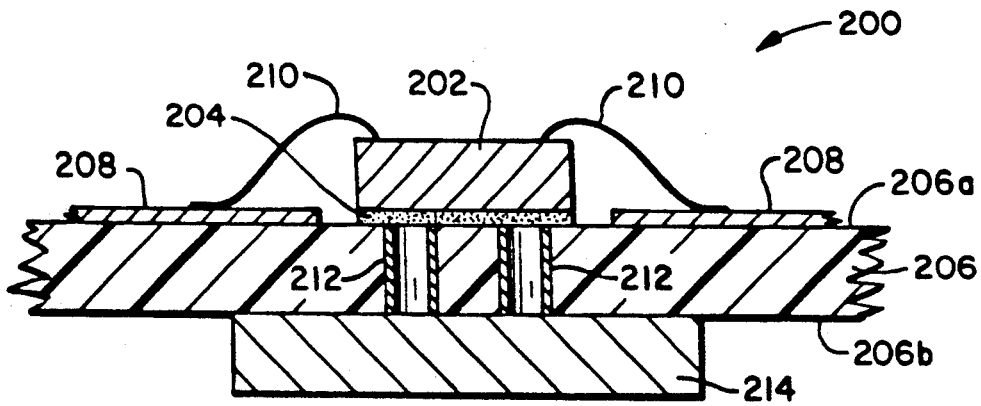
FIG. 2 is a cross-sectional view of another heat sink arrangement of the prior art.

FIG. 2 shows another semiconductor device assembly 200 of the prior art. A die 202 is mounted with a suitable adhesive 204 to one side 206a of a printed wiring board (PWB) 206. As in FIG. 1, the die is connected to conductive traces 208 on the PWB by bond wires 210, and would be encapsulated by epoxy (omitted in FIG. 2, for clarity). Rather than an entire slug (106b, FIG. 1) extending through a single large hole in the PWB, in this example a plurality (two illustrated) of copper plated vias 212 extend through the PWB from a side 206b of the PWB opposite the die to the die 202. A plate-like heat sink structure 214 is mounted to the PWB opposite the die (such as by epoxy, not shown), and the metal of the plated vias conducts heat from the die to the heat sink.

In this example, using vias (212) rather than a slug (106b) to conduct heat through the PWB from the die to the heat dissipating structure, thermal stresses are distributed among several vias rather than a single slug. However, the plated through holes (vias) 212 do not conduct heat as well as the solid structure of the plug 106b, inasmuch as the vias are largely void spaces.

One object of the present invention is to provide efficient thermal transfer from a die to a heat sink structure mounted to the opposite side of a PWB.

Figure 3:
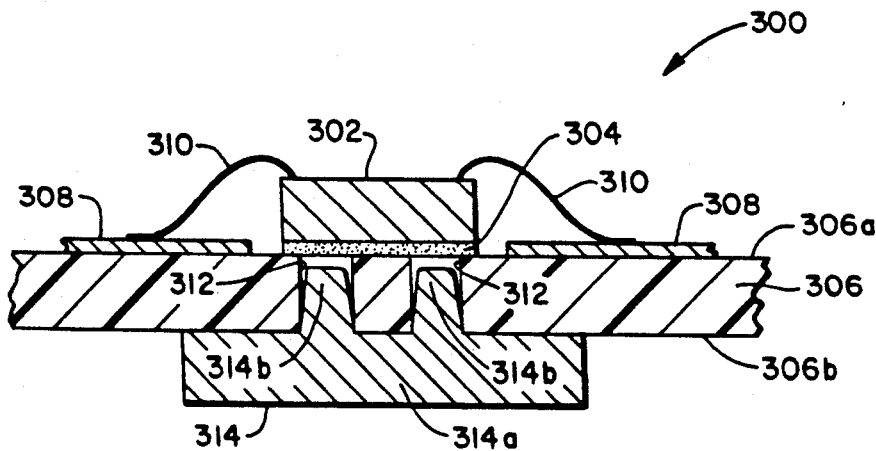
FIG. 3 is a cross-sectional view of the heat sink arrangement of the present invention.
Figure 4:
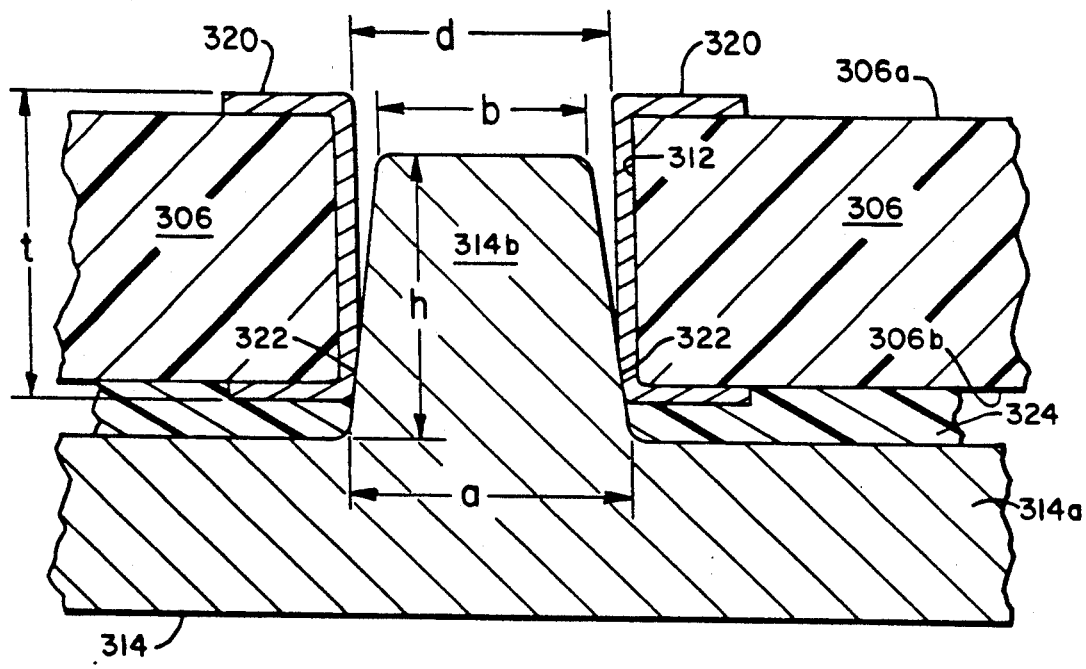
FIG. 4 is a detailed cross-sectional view of the heat sink arrangement of FIG. 3.
Figure 5:
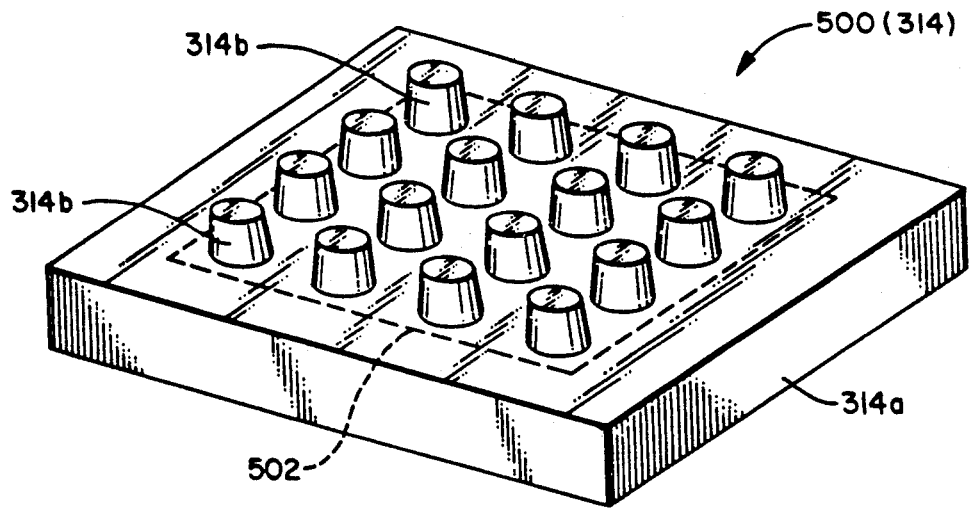
FIG. 5 is a perspective view of the heat sink of the present invention.

FIGS. 3 and 4 show a semiconductor device assembly 300 of the present invention. FIG. 4 is more detailed than FIG. 3, and shows some variations. FIG. 5 shows the heat sink, per se.

A die 302 is mounted with a suitable adhesive 304 to one face 306a of a printed wiring board (PWB) 306. As in FIGS. 1 and 2, the die is attached to conductive traces 308 on the face 306a of the PWB by bond wires 310. As in FIG. 1, the die and bond wires would be encapsulated with suitable epoxy (epoxy is omitted from the view of FIG. 3, for illustrative clarity).

The PWB 306 is provided with a plurality of through holes 312, extending from the die area on the face 306a of the PWB to the opposite face 306b. This is similar to the construction of FIG. 2, except that (as illustrated in FIG. 3) the through holes are not necessarily plated.

A heat sink structure 314 is provided opposite the die, and has two portions. A relatively large, plate-like, heat-dissipating portion 314a of the heat sink is disposed opposite the die (on the opposite face 306b of the PWB), and extends over an area larger than the die. The heat-dissipating portion is essentially a large flat plate. A plurality of "nubs" 314b protrude from the board-facing surface of the plate 314a, and extend into the holes 312, from one side 306b of the PWB towards the other side 306a.

Preferably there are a like plurality (equal number) of holes 312 through the PWB and nubs 314b on the heat sink.

The "profile", or shape of the nub is an important feature of the invention.

FIG. 4 shows in detail a single nub 314b extending through a single hole 312 in the PWB 306. In this view, the through hole 312 is plated, as indicated by copper plating 320.

The through holes 312 are cylindrical, and after plating (320) are still cylindrical. The through holes have a diameter "d", and a depth (through the PWB) "t". The nubs 314b also have a circular cross section, but are tapered generally like a truncated cone. The diameter of the nubs is greatest where they emanate integrally from the plate portion 314a of the heat sink, and is least where they extend nearly to the die (not shown in FIG. 4).

More particularly, the "base" diameter "a" of the nubs where they are joined to the plate portion 314a is slightly (on the order of 0.001 inch) greater than the diameter "r" of the plated through hole 312, and decreases gradually to a "top" diameter "b" less than r at its uppermost (as shown) extreme. In this manner, the lower portion of the nub forms an interference fit in a region 322 with the plated through hole 312, forming an intimate thermal path and providing some support for the plate 314a. Preferably, the nub is sized and shaped to "gall" the plating 320, on the opposite side 306b of the PWB and partially into the hole 312, holding the entire heat sink 314 in place on the opposite side 306b of the PWB opposite the die 302.

For additional support of the heat sink, and to hermetically seal the semiconductor device, it is advantageous to provide a layer of adhesive, such as epoxy 324 between the plate 314a and the undersurface 306b of the PWB. This is shown in FIG. 4.

The top diameter of the nub 314b is smaller than the diameter of the hole 312, and is radiussed so that the nub enters the hole easily.

Preferably, the heat sink is manufactured with powdered metal technology, from materials such as aluminum, copper, or copper/tungsten.

Returning to FIG. 4, we see that the nub 314b extends into the hole 312 from the opposite (back) side 306b of the PWB, towards the die mounting area on the front side 306a of the PWB. The PWB has a thickness (including plating) "t". The nub 314b has a height "h", less than or equal to "t". Preferably, the height of the nub is somewhat (on the order of 10-15 mils) less than the PWB thickness, to ensure that the nub does not push up on the die and to allow clearance for excess adhesive 304 (see FIG. 3) that may find its way into the hole 312.

FIG. 5 shows the heat sink structure 500 (314, FIGS. 3 and 4), per se. In this Figure, sixteen nubs 314b are illustrated emanating from an area 502 (indicated by dashed lines) on the PWB facing surface of the plate-like portion 314a. The number and size of the nubs depends on the specific application, and is readily adapted thereto, but it can be stated that the area 502 corresponds (is approximately equal) to the die size. Also, it is evident that for square dies, a square array of nubs would be provided. According to the invention, a square array of at least four nubs (two-by-two) is provided. Sixteen nubs (four-by-four square array) are illustrated in FIG. 5.

By using a plurality of nubs, rather than a single plug (106b, FIG. 1) or simply a plurality of plated through holes (212, FIG. 2), the heat sink assembly of the present invention provides efficient transfer of heat from the die on one side of the board to the heat-dissipating structure on the opposite side of the board while minimizing thermal stresses that are caused by disparate coefficients of expansion between the heat sink and the die or PWB.

It should be understood that the invention resides mainly in the use of a heat sink having a plurality of nubs extending through a PWB to underneath a die. Plating the through holes is optional, but preferable. Epoxying the plate portion of the heat sink to the underside of the PWB is optional, but preferable.

Figure 6:
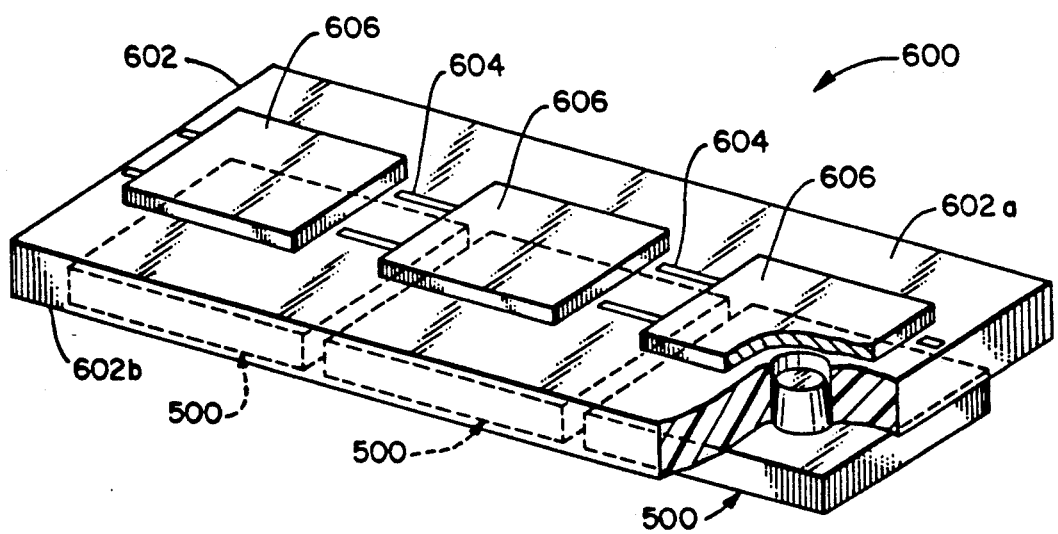
FIG. 6 is a perspective view of a multi-chip module, employing multiple heat sinks, according to the present invention.

FIG. 6 shows a multi-chip module 600 employing multiple heat sink structures 500 (314) of the present invention. The module includes a PWB 602 having conductive traces 604 (only a few of many shown, for simplicity) on its front face 602a. A plurality of dies 606 are mounted to the front face of the PWB, and connected to the conductive traces (connections not shown). Epoxy (not shown) is ultimately deposited over the dies (compare FIG. 1).

A number of heat sinks 500, corresponding to the number of dies (three, in this example) are disposed on the back face 602b of the PWB, in the manner illustrated in FIGS. 3 and 4.

What is claimed is:

1. Semiconductor device assembly comprising:
   a semiconductor die mounted with adhesive by its underside to one face of a printed wiring board substrate;
   a plurality "n" of through holes extending from the one face of the substrate to an opposite face of the substrate, in a region occupied by the die; and
   a heat sink structure disposed on the opposite face of the substrate including a relatively large plate-like heat dissipating portion, and a plurality of "n" of nubs extending from the plate-like portion through the holes towards the underside of the die;
   wherein:
   the substrate has a thickness "t";
   the nubs have a height "h"; and
   the height "h" of each nub is less than the thickness "t" of the substrate to ensure that the nub does not push up on the die and to allow a clearance for excess adhesive between the nubs and the die, when the nubs are inserted into the holes.

2. Semiconductor device assembly, according to claim 1, wherein:
   the substrate is a printed wiring board.

3. Semiconductor device assembly, according to claim 1, wherein:
   the heat sink structure is formed of powdered metal.

4. Semiconductor device assembly, according to claim 3, wherein:
   the powdered metal is selected from a group of materials including aluminum, copper and copper/tungsten alloy.

5. Semiconductor device assembly, according to claim 1, wherein:
   the through holes are plated with plating material.

6. Semiconductor device assembly, according to claim 5, wherein:
   the nubs are sized and shaped to gall the plating material.

7. Semiconductor device assembly, according to claim 1, further comprising:
   adhesive disposed between the plate-like portion of the heat sink and the opposite face of the substrate.

8. Semiconductor device assembly, according to claim 1, wherein:
   the nubs are tapered, and have a base diameter larger than the diameter of the through holes.

9. Semiconductor device assembly, according to claim 5, wherein:
   the nubs each have a lower portion with a first diameter adjacent the plate-like portion and an upper portion with a second diameter above the plate-like portion;
   the through holes are cylindrical, and have a third diameter "r";
   the first diameter "a" of the lower portion of the nubs is greater than the third diameter "r" of the through holes;
   the second diameter "b" of the upper portion of the nubs is less than the third diameter "r" of the through holes; and
   the lower portion of the nubs forms an interference fit in a lower portion of the through holes.

10. A multi-chip module, comprising:
    a plurality of semiconductor dies mounted with adhesive by their undersides to one face of a printed wiring board PWB;
    at each die location, a plurality of "n" of through holes extending through the PWB from the one face of the PWB to an opposite face of the PWB; and
    at each die location, a heat sink structure disposed on the opposite face of the PWB, including a relatively large plate-like heat dissipating portion, and a plurality of "n" of nubs extending from the plate-like portion through the holes towards the underside of the die;
    wherein:
    the PWB has a thickness "t";
    the nubs have a height "h"; and
    the height "h" of each nub is less than the thickness "t" of the PWB to ensure that the nub does not push up on the die and to allow a clearance for excess adhesive between the nubs and the die, when the nubs are inserted into the holes.

* * * * *